(12) United States Patent
Magee et al.

(10) Patent No.: US 7,605,628 B2
(45) Date of Patent: Oct. 20, 2009

(54) SYSTEM FOR GLITCH-FREE DELAY UPDATES OF A STANDARD CELL-BASED PROGRAMMABLE DELAY

(75) Inventors: Terence J. Magee, San Francisco, CA (US); Thomas Hughes, San Francisco, CA (US); Hui-Yin Seto, San Jose, CA (US)

(73) Assignee: LSI Corporation, Milpitas, CA (US)

( * ) Notice: Subject to any disclaimer, the term of this patent is extended or adjusted under 35 U.S.C. 154(b) by 231 days.

(21) Appl. No.: 11/745,108

(22) Filed: May 7, 2007

(65) Prior Publication Data

US 2008/0278210 A1    Nov. 13, 2008

(51) Int. Cl.
*H03H 11/26* (2006.01)
(52) U.S. Cl. .................... 327/261; 327/276
(58) Field of Classification Search ............... 327/261, 327/276
See application file for complete search history.

(56) References Cited

U.S. PATENT DOCUMENTS

| | | | |
|---|---|---|---|
| 5,287,025 A * | 2/1994 | Nishimichi | 327/156 |
| 6,300,807 B1 * | 10/2001 | Miyazaki et al. | 327/158 |
| 2003/0126485 A1 * | 7/2003 | Wilcox et al. | 713/320 |
| 2006/0164909 A1 * | 7/2006 | Gower et al. | 365/233 |
| 2007/0217559 A1 * | 9/2007 | Stott et al. | 375/355 |

* cited by examiner

*Primary Examiner*—Lincoln Donovan
*Assistant Examiner*—Ryan C Jager
(74) *Attorney, Agent, or Firm*—Christopher P. Maiorana, PC

(57) ABSTRACT

A method for glitch-free updates of a standard cell-based programmable delay including the steps of (A) generating an output signal in response to an input signal and a plurality of first control signals and (B) generating the plurality of first control signals in response to the output signal and a plurality of second control signals. The output signal may include a delayed version of the input signal. An amount of delay between the input signal and the output signal may be determined based upon the plurality of first control signals.

20 Claims, 5 Drawing Sheets

SYSTEM FOR GLITCH-FREE DELAY UPDATES OF A STANDARD CELL-BASED PROGRAMMABLE DELAY

RELATED APPLICATIONS

This application may be related to a commonly owned U.S. patent application Ser. No. 11/643,492, filed Dec. 21, 2006, which is herein incorporated by reference in its entirety.

FIELD OF THE INVENTION

The present invention relates to programmable delays generally and, more particularly, to a system for glitch-free delay updates of a standard cell-based programmable delay.

BACKGROUND OF THE INVENTION

A delay can be included in a clock or strobe path to strobe data in the center of an eye pattern. The delay can be subject to voltage and temperature (VT) variation. The delay can also be dependant on a frequency of the clock or strobe. The delay can be implemented using a conventional standard cell-based programmable delay. The conventional standard cell-based programmable delay can be implemented by cascading single delay elements with each delay element controlled by a respective control bit.

The conventional standard cell-based programmable delay does not allow changing the delay settings without altering the clock or strobe signal, or propagating glitches. In the conventional delay, the switching of the control bits can cause glitches to form in the delay elements. The glitches can be propagated to the clock or strobe output. The glitches can corrupt the clock or strobe signal passing through the delay circuit. Compensation for the disadvantages of the conventional standard cell-based programmable delay can involve added overhead that (i) disrupts or disables the clock or strobe signal during the period when the delay control is updated and (ii) blocks any propagated glitches from triggering a false sampling of data or from further propagating through the system.

It would be desirable to have a system for glitch-free delay updates of a standard cell-based programmable delay that may be used to adapt delay settings with VT variation without disrupting the clock or strobe. It would be further desirable for the adaptation to be transparent to the overall system in which the clock or strobe path is a part.

SUMMARY OF THE INVENTION

The present invention concerns a method for glitch-free updates of a standard cell-based programmable delay including the steps of (A) generating an output signal in response to an input signal and a plurality of first control signals and (B) generating the plurality of first control signals in response to the output signal and a plurality of second control signals. The output signal may include a delayed version of the input signal. An amount of delay between the input signal and the output signal may be determined based upon the plurality of first control signals.

The objects, features and advantages of the present invention include providing a system for glitch-free delay updates of a standard cell-based programmable delay that may (i) support changing control bits without glitching an output, (ii) support increasing or decreasing the delay by a single delay element while simultaneously receiving a clock or strobe, (iii) support applications where the delay on a clock or strobe is critical to correct data sampling, (iv) be used to adapt control settings of a delay that varies as voltage and temperature (VT) varies, (v) allow increasing or decreasing the delay by a single delay element without disrupting or disabling the input clock or strobe, (vi) enable the delay on a clock or strobe to be continuously adapted in systems where the delay may change with time and any updates to the delay control must be performed without disrupting the clock or strobe and/or (vii) be transparent to a data sampling function.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
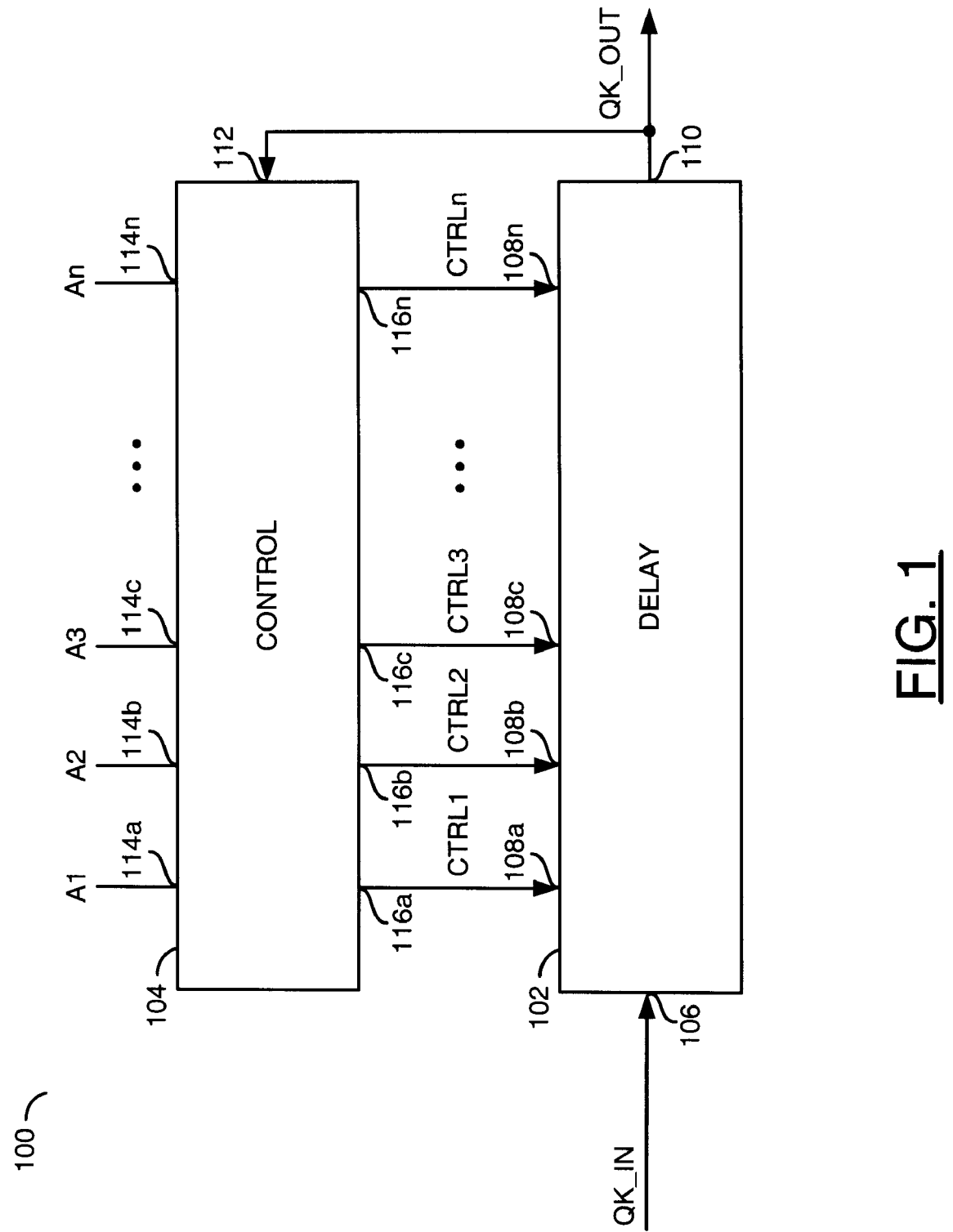
FIG. 1 is a block diagram illustrating a programmable delay circuit in accordance with the present invention.

Referring to FIG. 1, a block diagram of circuit 100 is shown illustrating a programmable delay circuit in accordance with the present invention. The circuit 100 may comprise a first block (or circuit) 102 and a second block (or circuit) 104. The block 102 may be implemented as a delay block. The block 104 may be implemented as a control block. The block 102 may have a first input 106 that may receive a signal (e.g., QK_IN), a plurality of second inputs 108a-108n that may receive a number of signals (e.g., CTRL1_CTRLn) and an output 110 that may present a signal (e.g., QK_OUT). The signal QK_IN may be implemented, in one example, as a clock or strobe signal. The signal QK_OUT may comprise a delayed version of the signal QK_IN. The signals CTRL1-CTRLn may be implemented as control signals. In one example, the signals CTRL1-CTRLn may be implemented as individual control signals. In another example, the signals CTRL1-CTRLn may be implemented as individual bits of a multi-bit control signal. A delay between the signal QK_IN and QK_OUT may be determined based upon the signals CTRL1-CTRLn. The block 102 may be implemented using conventional techniques.

The block 104 may have a first input 112 that may receive the signal QK_OUT, a plurality of second inputs 114a-114n that may receive a number of signals (e.g., A1-An) and a plurality of outputs 116a-116n that may present the signals CTRL1-CTRLn. The signals A1-An may be implemented as control signals. In one example, the signals A1-An may be implemented as individual control signals. In another example, the signals A1-An may be implemented as individual bits of a multi-bit control signal. The block 104 may be configured to generate and/or update the signals CTRL1-CTRLn in response to the signals A1-An and the signal QK_OUT. The block 104 generally allows the delay between the signals QK_OUT and QK_IN to be varied without disrupting or corrupting the signals or causing glitches.

Figure 2:
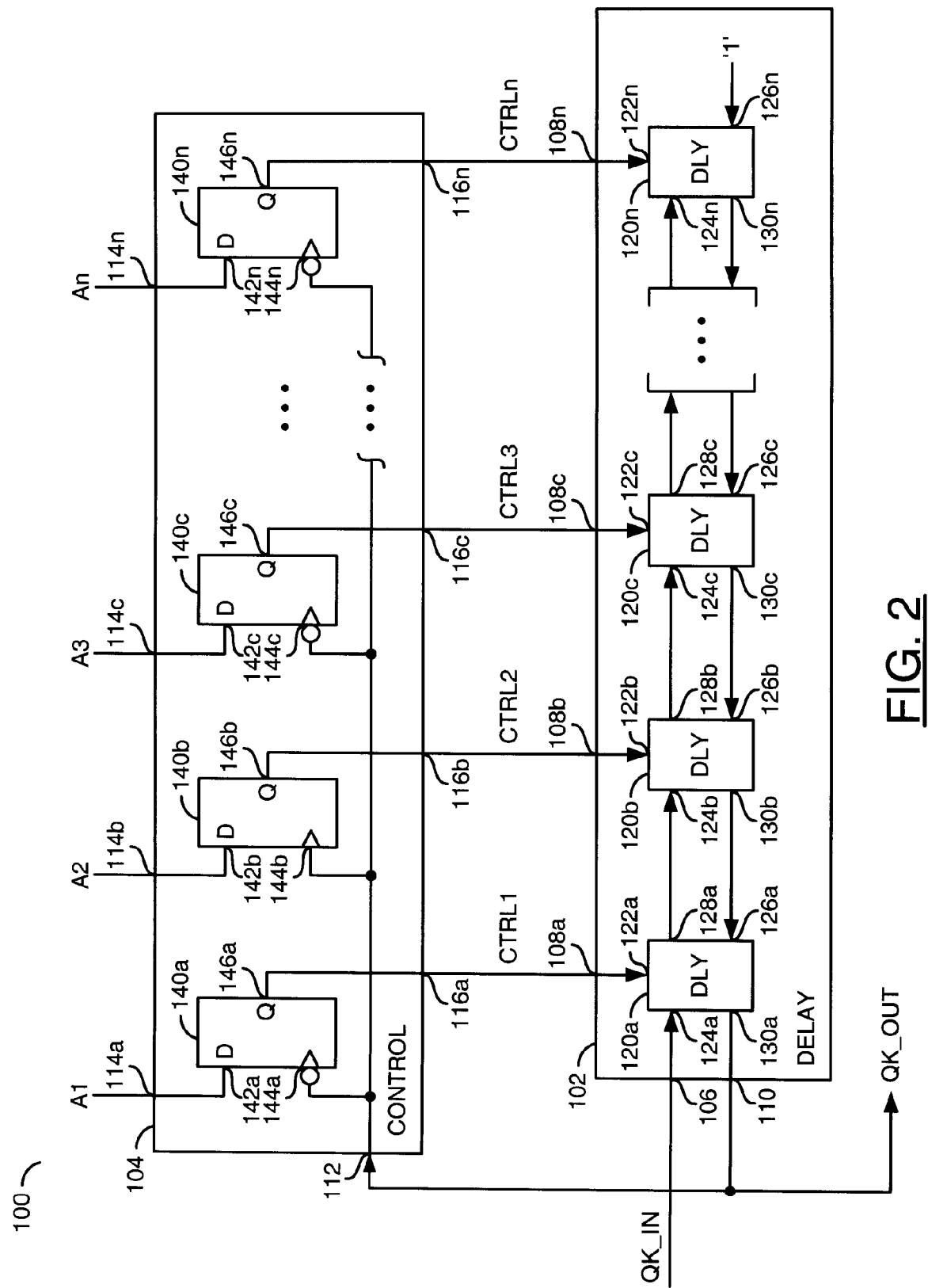
FIG. 2 is a block diagram illustrating a programmable delay circuit in accordance with a preferred embodiment of the present invention.

Referring to FIG. 2, a block diagram of the circuit 100 is shown illustrating an implementation in accordance with a preferred embodiment of the present invention. The block 102 may comprise a plurality of blocks (or circuits) 120a-120n. The blocks 120a-120n may be implemented as delay blocks. The blocks 120a-120n may be implemented using conventional techniques. In one example, each of the blocks 120a-120n may have a first input 122a-122n, a second input 124a-124n, a third input 126a-126n, a first output 128a-128n and a second output 130a-130n, respectively. However, other types and configurations of delay blocks may be implemented accordingly to meet the design criteria of a particular implementation.

Each of the signals CTRL1-CTRLn may be presented to a respective one of the inputs 122a-122n. The signal QK_IN may be presented to the input 124a. Each of the inputs 124b-124n may receive a signal from one of the outputs 128a-128(n−1). Each of the inputs 126a-126(n−1) may receive a signal from one of the outputs 130b-130n. The input 126n may be tied to a logic '1', or HIGH. The signal QK_OUT may be presented at the output 130a.

The block 104 may comprise a plurality of blocks (or circuits) 140a-140n. The blocks 140a-140n may be implemented, for example, as flip-flops or registers. In one example, the blocks 140a-140n may be implemented as D-type flip-flops. In one example, each of the blocks 140a-140n may have a first input 142a-142n, a second input 144a-144n and an output 146a-146n. The inputs 144a-144n may be implemented as clock inputs. Each of the inputs 142a-142n may receive a respective one of the signals A1-An. The signal QK_OUT may be presented to each of the inputs 144a-144n. The signals CTRL1-CTRLn may be presented at the outputs 146a-146n.

In one example, the blocks 140a-140n may be configured to trigger on a rising edge or a falling edge of the signal QK_OUT. In one example, the blocks 140a-140n may be configured such that adjacent blocks trigger on complementary (or opposite) edges of the signal QK_OUT. For example, the blocks 140a, 140c, etc. may be implemented as negative-edge triggered flip-flops and the blocks 140b, 140d, etc. may be implemented as positive-edge triggered flip-flops. Alternatively, the blocks 140a-140n may all be positive or negative-edge triggered and inverters may be implemented between the signal QK_OUT and the input 144 on alternating ones of the blocks 140a-140n. In another example, a complement of the signal QK_OUT may be generated (e.g., using an invertor) and the true and complementary signals presented to the respective blocks 140a-140n.

Figure 3:
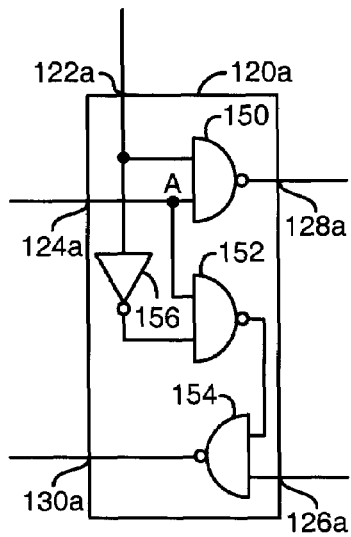
FIG. 3 is a block diagram illustrating an example standard cell delay circuit of FIG. 2.

Referring to FIG. 3, a block diagram of an example circuit 120a is shown illustrating a programmable delay element (or circuit) in accordance with a preferred embodiment of the present invention. In one example, each of the blocks 120a-120n may comprise a block (or circuit) 150, a block (or circuit) 152, a block (or circuit) 154 and a block (or circuit) 156. The blocks 150, 152 and 154 may be implemented as a two-input NAND gates. The block 156 may be implemented as an inverter (or NOT) gate.

Using the block 120a as an example, the input 122a may be connected to a first input of the block 150 and an input of the block 156. An output of the block 156 may be connected to an first input of the block 152. The input 124a may be connected to a second input of the block 150 and a second input of the block 152. An output of the block 150 may be connected to the output 128a. An output of the block 152 may be connected to a first input of the block 154. The input 126a may be connected to a second input of the block 154. An output of the block 154 may be connected to the output 130a. The blocks 120b-120n may be implemented similarly.

Figure 4:
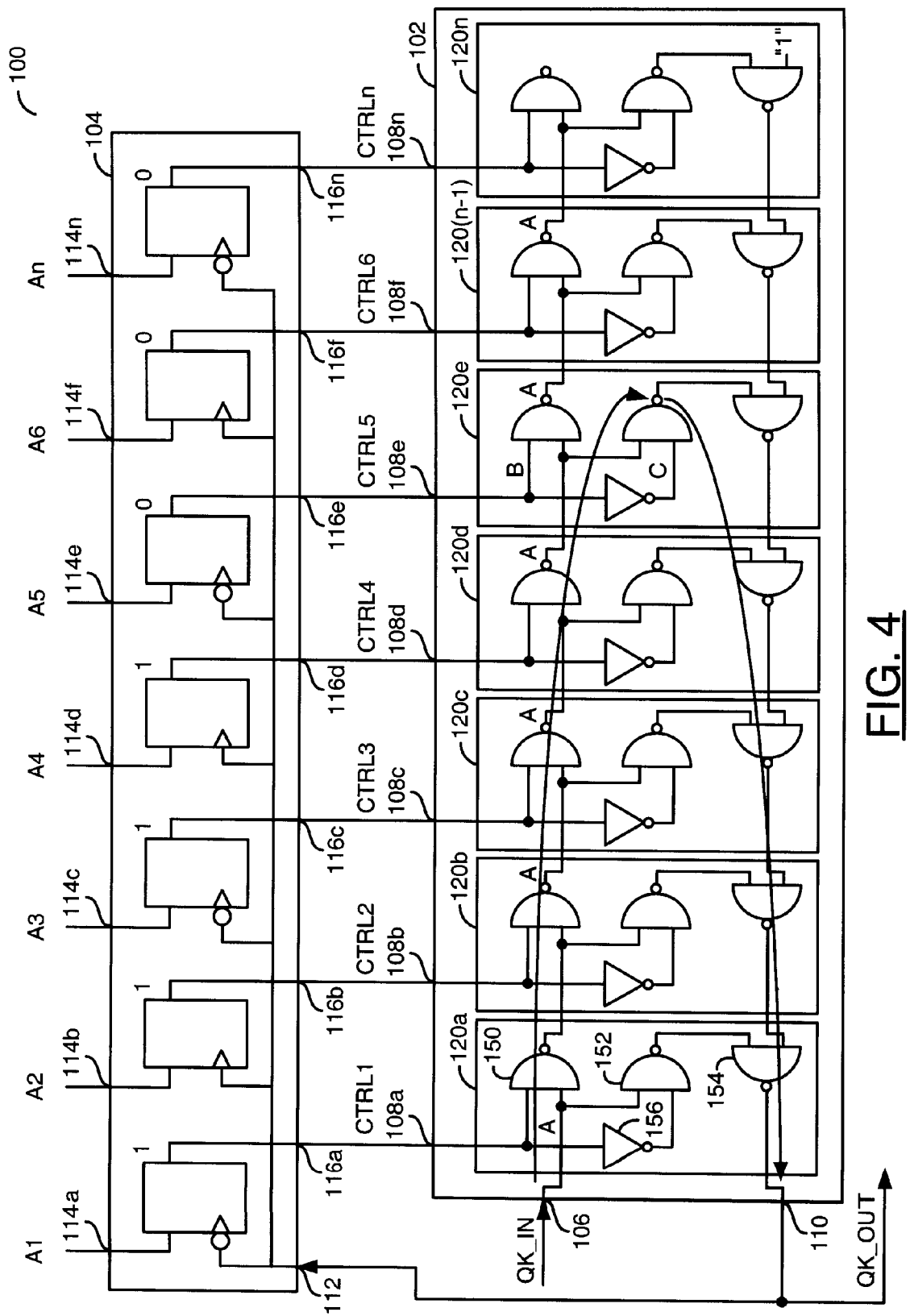
FIG. 4 is a block diagram illustrating the programmable delay circuit of FIG. 2 implemented using the standard cell delay circuit of FIG. 3.

Referring to FIG. 4, a block diagram is shown illustrating an example of the circuit 100 implemented in accordance with a preferred embodiment of the present invention. The circuit 100 may be configured to increase or decrease a delay by one delay element at a time. The increase or decrease may be made without disabling or disrupting the clock or strobe signal. For example, a number of control bits (e.g., the signals A1-A4) may be set to a logical 1 and every control bit after a first control bit having a value of logical 0 (e.g., the signal A5) may also be set to logical 0 (e.g., the signals A6-An). The signals A1-An may be generated such that only a single control bit may change at one time. For a delay increment, the control bit that is changed may be the first logical 0 control bit after a logical 1 control bit (e.g., as illustrated by the signal A5 in FIG. 4). For a delay decrement, the control bit that is changed may be the last logical 1 control bit before the first logical 0 control bit (e.g., as illustrated by the signal A4 in FIG. 4). In general, the circuit 104 may provide glitch-free updates of the delay provided by the circuit 102.

The signal QK_IN may enter the delay cell at the gate 150 of the stage 120a. The signal may continue to propagate from the stage 120a toward the stage 120n through each successive gate 150 until reaching a stage where a respective control bit (e.g., signals CTRL1-CTRLn) is a logical "0", or LOW. In the stage where the respective control bit is LOW, the propagating signal may be diverted through the gate 152 and the gate 154 of the stage if the control bit of the successive stage is also LOW, or a logical "0". The propagated signal may then propagate through each successive gate 154 toward the stage 120a until exiting as the signal QK_OUT.

In one example, the control bit of a delay element may be switched only when a node A (e.g., the node connected to the respective input 124 of the delay element) is a logical 0. The value at the node A of the delay element generally depends on the state of the clock or strobe signal (e.g., the signal QK_IN) propagating to the node. At any one time, the logical state at each node A is generally inverted for each successive delay element. By clocking each control flip-flip by alternate edges of the signal QK_OUT, the switching of the control bits may be guaranteed to occur only when the node A of the respective delay element is a logical 0. When switching of the control bits occurs only when the node A of the respective delay element is a logical 0, the delay switching generally does not cause glitching and does not disrupt the free running clock.

The delay from when node A transitions from logical 1 to logical 0, to when the transition is propagated out as the signal QK_OUT, to clocking the control flip-flop of the respective stage and switching the control bit may form a critical timing path of the circuit 100. The switching of the control bit and propagation of the control bit to a node B and a node C should occur while node A is a logical 0.

Figure 5:
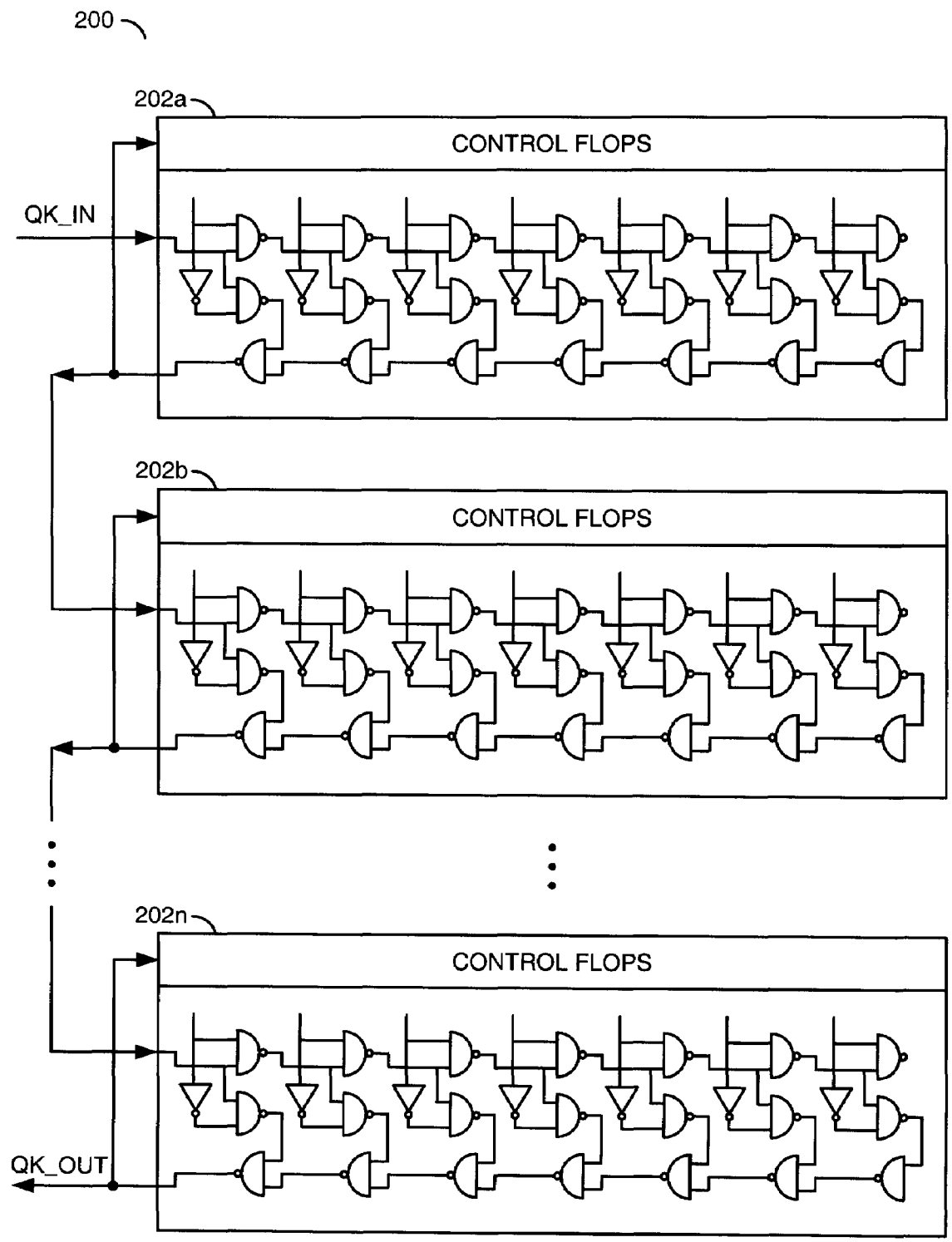
FIG. 5 is a block diagram illustrating a delay cell implemented using a number of programmable delay circuits cascaded in accordance with the present invention.

Referring to FIG. 5, a block diagram is shown illustrating a delay cell 200 comprising a number of circuits 202a-202n cascaded together in accordance with another preferred embodiment of the present invention. When the overall delay is large enough such that the aforementioned critical timing path is difficult to achieve from a timing perspective, the delay cell 200 may be partitioned into smaller delay stages 202a-202n of identical construction, in cascade. In one example, each of the smaller stages 202a-202n may be implemented using the circuit 100. The delay cell 200 may have a fixed overhead that may be measured when each control bit is set at logical 0. In one example, the fixed overhead may comprise an offset of 2 gates for each delay stage.

Figure 6:
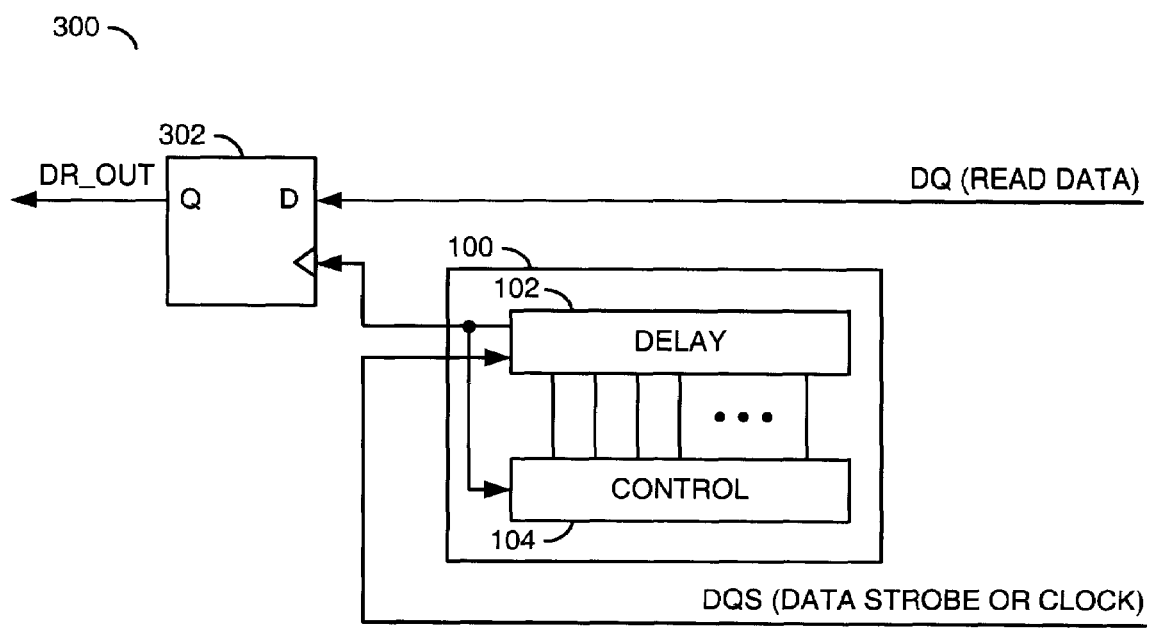
FIG. 6 is a block diagram illustrating a standard cell-based programmable delay in accordance with the present invention implemented in a read data path.

Referring to FIG. 6, a block diagram is shown illustrating a read data path 300 implemented with a standard cell-based programmable delay circuit 100 in accordance with the present invention. The read data path 300 may be implemented as part of a random access memory (RAM). In one example, the memory may be implemented as a double data rate (DDR) RAM. The read data path 300 may comprise a register (or latch) 302 that may be configured to latch read data (e.g., DQ) in response to a data strobe or clock (e.g., DQS). The circuit 100 may be configured to couple the signal DQS to a clock input of the register 302. The circuit 100 may delay the signal DQS to ensure the register 302 latches the signal DQ in the middle of a data eye pattern.

The present invention generally supports changing the control bits without glitching the output. The present invention generally supports increasing or decreasing the delay by a single delay element while simultaneously receiving the clock or strobe. The present invention generally supports applications where the delay on a clock or strobe is critical to the clock or strobe correctly sampling data. Such delay may vary as voltage and temperature (VT) varies. In one example, the present invention may be used in conjunction with a system or method for compensating for process/voltage/temperature (PVT) variation effects on the delay line of a clock signal as found in U.S. Ser. No. 11/643,492, filed Dec. 21, 2006, which is herein incorporated by reference in its entirety. The control settings of the delay may be adapted accordingly.

The input clock or strobe delayed using an embodiment of the present invention is generally not disrupted or disabled while increasing or decreasing the delay by a single delay element. The present invention generally enables the delay on a clock or strobe to be continuously adapted in systems where (i) the delay may change with time, (ii) any updates to the delay control are to be performed without disrupting the clock or strobe and (iii) updates to the delay control are to be transparent to the data sampling function.

The various signals of the present invention are generally "on" (e.g., a digital HIGH, or 1) or "off" (e.g., a digital LOW, or 0). However, the particular polarities of the on (e.g., asserted) and off (e.g., de-asserted) states of the signals may be adjusted (e.g., reversed) to meet the design criteria of a particular implementation. Additionally, inverters may be added to change a particular polarity of the signals.

While the invention has been particularly shown and described with reference to the preferred embodiments thereof, it will be understood by those skilled in the art that various changes in form and details may be made without departing from the scope of the invention.

The invention claimed is:

1. A method for glitch-free updates of a standard cell-based programmable delay comprising the steps of:
generating an output signal in response to an input signal and a plurality of first control signals, wherein said output signal comprises a delayed version of said input signal and an amount of delay between said input signal and said output signal is determined based upon said plurality of first control signals; and
generating said plurality of first control signals in response to said output signal and a plurality of second control signals, wherein a first number of said plurality of second control signals and a second number of said plurality of second control signals are latched on opposite transitions of said output signal.

2. The method according to claim 1, further comprising changing the amount of delay without disrupting, corrupting or disabling said input signal.

3. The method according to claim 1, wherein the amount of delay between said input signal and said output signal is updated glitch-free.

4. The method according to claim 1, wherein said input signal comprises a signal selected from the group consisting of a clock signal and a strobe signal.

5. The method according to claim 1, further comprising:
adjusting said amount by which said output signal is delayed with respect to said input signal to center a strobe of a data signal in an eye pattern.

6. The method according to claim 1, further comprising:
adjusting the delay by changing a state of one of said plurality of second control signals at a time.

7. The method according to claim 1, wherein generating said plurality of first control signals in response to said output signal and a plurality of second control signals comprises using said output signal to clock a plurality of flip-flops to latch said plurality of second control signals.

8. The method according to claim 7, further comprising clocking adjacent flip-flops on said opposite transitions of said output signal.

9. The method according to claim 1, further comprising:
cascading a plurality of delay cells to increase a range of the amount of delay between said input signal and said output signal, wherein each of said delay cells perform the steps according to claim 1.

10. A delay cell comprising:
means for generating an output signal in response to an input signal and a plurality of first control signals, wherein said output signal comprises a delayed version of said input signal and an amount of delay between said input signal and said output signal is determined based upon said plurality of first control signals; and
means for generating said plurality of first control signals in response to said output signal and a plurality of second control signals, wherein a first number of said plurality of second control signals and a second number of said plurality of second control signals are latched on opposite transitions of said output signal.

11. An apparatus comprising:
a first circuit configured to generate an output signal in response to an input signal and a plurality of first control signals, wherein said output signal comprises a delayed version of said input signal and an amount of delay between said input signal and said output signal is determined based upon said plurality of first control signals; and
a second circuit configured to generate said plurality of first control signals in response to said output signal and a plurality of second control signals, wherein a first number of said plurality of second control signals and a second number of said plurality of second control signals are latched on opposite transitions of said output signal.

12. The apparatus according to claim 11, wherein said second circuit is configured to increase or decrease the amount of delay by a single delay element without disrupting or disabling the input signal.

13. The apparatus according to claim 11, wherein said input signal comprises a signal selected from the group consisting of a clock signal and a strobe signal.

14. The apparatus according to claim 11, wherein said output signal is configured to center a strobe of a data signal in an eye pattern.

15. The apparatus according to claim 14, wherein said amount by which said output signal is delayed with respect to said input signal is adjusted by changing a state of one of said plurality of second control signals.

16. The apparatus according to claim 11, wherein only one of said second control signals changes state at a time.

17. The apparatus according to claim 11, wherein said second circuit comprises a plurality of flip-flops configured to generate said plurality of first control signals in response to said plurality of second control signals and said output signal.

18. The apparatus according to claim 17, wherein adjacent flip-flops are clocked on said opposite transitions of said output signal.

19. The apparatus according to claim 11, wherein said first circuit comprises a plurality of delay elements, each controlled by one of said plurality of first control signals.

20. The apparatus according to claim 11, wherein (i) said first circuit and said second circuit form a first delay cell, (ii) said apparatus further comprises one or more additional delay cells and (iii) said first delay cell and said one or more additional delay cells are cascaded.

* * * * *